(12) United States Patent
Nishibayashi (10) Patent No.: US 6,270,848 B1
(45) Date of Patent: Aug. 7, 2001

(54) HEAT SINK MATERIAL FOR USE WITH SEMICONDUCTOR COMPONENT AND METHOD FOR FABRICATING THE SAME, AND SEMICONDUCTOR PACKAGE USING THE SAME

(75) Inventor: Yoshiki Nishibayashi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/577,968

(22) Filed: May 25, 2000

Related U.S. Application Data (62) Division of application No. 09/019,798, filed on Feb. 6, 1998, now Pat. No. 6,171,691.

(30) Foreign Application Priority Data

Feb. 6, 1997 (JP) .................................................. 9-023891

(51) Int. Cl.⁷ ........................................................ B22F 7/08
(52) U.S. Cl. ............................... 427/402; 419/10; 419/11; 419/23
(58) Field of Search ............................... 427/402; 419/10, 419/11, 23

(56) References Cited

U.S. PATENT DOCUMENTS

| 3,929,432 | 12/1975 | Caveney . |
|---|---|---|
| 4,024,675 | 5/1977 | Naidich et al. . |
| 5,120,495 | 6/1992 | Supan et al. . |
| 5,130,771 | 7/1992 | Burnham et al. . |
| 5,783,316 | 7/1998 | Colella et al. . |

FOREIGN PATENT DOCUMENTS

| 0717125 | 6/1996 | (EP) . |
|---|---|---|
| 0859408 | 8/1998 | (EP) . |
| 62-249462 | 10/1987 | (JP) . |
| 2-15977 | 1/1990 | (JP) . |
| 2-170452 | 7/1990 | (JP) . |
| 3-9552 | 1/1991 | (JP) . |
| 4-231436 | 8/1992 | (JP) . |
| 4-259305 | 9/1992 | (JP) . |
| 5-291444 | 11/1993 | (JP) . |
| 5-347370 | 12/1993 | (JP) . |
| 6-326432 | 11/1994 | (JP) . |

OTHER PUBLICATIONS

"Dymalloy: A Composite Substrate for High Power Density Electronic Components", by Kerns et al., The International Journal of Microcircuits and Electronic Packaging, vol. 19, No. 3, 3rd Quarter 1996, pp. 206–211. (no month).

"Copper–Diamond Composite Substrates for Electronic Components", by Davidson et al., IEEE (1995), p. 538. (no date).

*Primary Examiner*—Archene Turner
(74) *Attorney, Agent, or Firm*—McDermott, Will & Emery (57) ABSTRACT

A heat sink material for use with a semiconductor component having a coefficient of thermal expansion near to that of a semiconductor material and a high thermal conductivity, comprising a plurality of diamond particles, a metal, and a metal carbide, wherein the metal carbide and diamond particles constitute the matrix, and the metal fills the interstices of the matrix is provided. Also disclosed are a method for fabricating the same and a semiconductor package using the same.

7 Claims, 6 Drawing Sheets

HEAT SINK MATERIAL FOR USE WITH SEMICONDUCTOR COMPONENT AND METHOD FOR FABRICATING THE SAME, AND SEMICONDUCTOR PACKAGE USING THE SAME

This application is a Divisional of application Ser. No. 09/019,798 filed Feb. 6, 1998 now U.S. Pat. No. 6,171,691.

BACKGROUND OF THE INVENTION

1. Field of the Invention

The present invention relates to a heat sink material for releasing heat from a semiconductor component, and to a method for fabricating the same. The present invention also relates to a semiconductor device package or to a heat-release jig equipped with a heat sink formed of the inventive material

2. Background Art

Copper (Cu) is known as a typical material for use as a heat sink. However, although Cu has a relatively high thermal conductivity of 398 W/mK, the coefficient of thermal expansion is also large, having a value of 17 ppm/°C. Thus, when Cu is joined with a semiconductor, such as silicon (Si) having a coefficient of thermal expansion of 4.2 ppm/°C. or gallium arsenide (GaAs) having a coefficient of thermal expansion of from 6 to 7 ppm/°C., both of the joined materials suffer a large thermal stress in the cooling process from the joining temperature to room temperature, or in the cooling process from the maximum temperature achieved during the operation of the semiconductor component to room temperature. In many cases, such a large thermal stress makes the component unfeasible for use. In the light of such circumstances, alloys of Cu with a material having small coefficient of thermal expansion (e.g., W (tungsten) or Mo (molybdenum)), such as CuW and CuMo are used. That is, design of a heat sink material which matches the semiconductor package is made possible by using a material whose coefficient of thermal expansion is controllable. In such cases, however, the alloy becomes inferior to Cu in terms of thermal conductivity, i.e., having a value of about 200 W/mK, because the metals (W or Mo) alloyed with Cu have small thermal conductivity.

Diamond has the highest thermal conductivity in the temperature range of from room temperature to the high temperature region of 200° C. Moreover, the coefficient of thermal expansion thereof in the vicinity of room temperature is about 1.5 ppm/°C., which is smaller as compared with ordinary semiconductor materials such as Si and GaAs.

Therefore, it has been thought of using metallic materials containing particles of diamond embedded therein having such superior characteristics.

The idea of embedding diamond particles is disclosed in, for example, JP-A-Sho62-249462 (the term "JP-A-" as used herein signifies "an unexamined published Japanese patent application"), JP-A-Hei2-170452, JP-A-Hei3-9552, JP-A-Hei4-231436, JP-A-Hei4-259305, JP-A-Hei5-291444, and JP-A-Hei5-347370.

Disclosed in JP-A-Sho62-249462 is a material in which diamond is incorporated in a resin to improve thermal conductivity. However, since a resin generally is a poor conductor of heat, the thermal conductivity as a whole is not much improved.

Disclosed in JP-A-Hei2-170452, JP-A-Hei4-231436, JP-A-Hei4-259305, and JP-A-Hei5-347370 is disclosed a material comprising diamond particles embedded in a metallic matrix. Gold (Au), silver (Ag), copper (Cu), aluminum (Al), magnesium (Mg), etc., are used for the metallic matrix.

Also known (see H. L. Davidsonet et al., IEEE (1995), pp. 538) is a material based on diamond, which is prepared by subjecting diamond to special coating with a metal, and then impregnating the resulting material with an alloy of Cu and Ag.

All of the cases described above comprises incorporating diamond particles into a metallic matrix. That is, the diamond particles are separated from each other with a metallic material interposed therebetween. Accordingly, heat should also be transferred by the metallic material, that is, by a material sequence ordered in the order of diamond/metal/diamond/metal/ - - - . This structure is disadvantageous not only because thermal conductivity is impaired by the junction formed between diamond and the metallic material, but also because the sample itself cannot be shaped easily due to the weak bonding at the junction between diamond and the metallic material. In fact, the thermal conductivity achieved by a conventional heat sink was found to be 400 W/mK at best.

SUMMARY OF THE INVENTION

Thus, an object of the present invention is to provide a heat sink for use with a semiconductor component, having a coefficient of thermal expansion well comparable to that of a semiconductor material and yet having high thermal conductivity.

Another object of the present invention is to provide a semiconductor device package which effectively releases heat upon its assembly and when the semiconductor component is in operation.

As a result of extensive study of the present inventors, it has been found that, by utilizing a material comprising a plurality of diamond particles previously connected with each other by a metal carbide and having an interstitial metal, a heat sink for use with a semiconductor component having a coefficient of thermal expansion close to that of the semiconductor material and having an extremely high thermal conductivity can be obtained.

Thus, the heat sink material for use with a semiconductor component according to the present invention comprises a plurality of diamond particles, a metal, and a metal carbide, wherein the metal carbide and diamond particles constitute the matrix, and the metal fills the interstices of the matrix.

The phrase "material comprising a metal carbide and diamond particles constituting a matrix" as referred to herein signifies a "material comprising a plurality of diamond particles connected together by a metal carbide". More specifically, this material maintains the connected structure of diamond particles and metal carbide even when the metal of the heat sink is molten.

The basic concept of the present invention is that the diamond particles are not buried in metal, but that a metal carbide (or a metal carbide and graphite) is formed (grown) on the surface of the diamond particles to connect them together, which combination is then impregnated with a metal (Cu, Ag, Au, or Al). Briefly, the concept is more like a case of forming sintered diamond, and then incorporating an interstitial metal. The only difference is that the diamond particles themselves are not bonded together; thus, this material is different from sintered diamond.

Concerning the structure, the diamond particles are incorporated in the matrix of a metal carbide such as TiC, ZrC, or HfC, and a metal fills the interstices of the matrix comprising the diamond particles and the metal carbide. Thus, it can be seen that the structure of the heat sink for use with a semiconductor component according to the present invention greatly differs from the conventional one in which diamond particles are buried in a metal. More specifically, if metal is removed from a conventional heat sink material for a semiconductor component, the diamond particles become disunited. In contrast to this, the diamond particles remain connected to each other in the heat sink according to the present invention.

In the conventional case, furthermore, a metal is always incorporated between each pair of diamond particles. Although there may partly be such a component in the heat sink of the present invention, many parts consist of a metal carbide alone. That is, many parts consist of only metal carbide incorporated between different diamond particles, and the metal carbide is in contact with the surfaces of the different diamond particles.

In such a material, heat is transferred by lattice vibration alone. Thus, when compared with the conventional case in which heat is transferred by lattice vibration/electron/lattice vibration/electron - - -, it can be readily anticipated that a high thermal conductivity is achieved. Moreover, mechanical bonding strength is increased in such a case.

It is preferred to incorporate graphite in the matrix, because graphite may contribute to the improvement of thermal conductivity.

Preferably, the diamond particles have an average diameter of 60 $\mu$m or larger, but not more than 700 $\mu$m. If the diamond particles are less than 60 $\mu$m in average diameter, the thermal conductivity tends to become too low; if the diamond particles exceed 700 $\mu$m in average diameter, they lead to the generation of cracks in a semiconductor substrate when the heat sink is joined to the semiconductor component for use therewith. That is, when diamond particles having too large an average diameter are used, the in-plane distribution of the thermal expansion coefficient is found to greatly fluctuate so as to make it impossible for a thin semiconductor substrate to tolerate such a fluctuation. Thus, cracks are believed to form by-such a mechanism.

The metal preferably is at least one selected from the group consisting of Ag, Cu, Au, and Al. The use of such a material makes it possible to achieve high thermal conductivity.

The metal carbide is at least one selected from the group consisting of TiC. ZrC, and HfC.

Preferably, metal carbides accounts for 5% or less by volume of the entire body. If the volume fraction of the metal carbides exceeds 5%, the amount of metallic component tends to become too large so as to deteriorate the thermal characteristics of the heat sink when used with a semiconductor component.

It is also preferred that the surface of the heat sink material is coated with a metal by means of plating or vapor deposition.

Furthermore, at least one of the insulators AlN and $Al_2O_3$ is used for joining the surface of the heat sink with a semiconductor component.

The structures described above can be implemented by a method according to the present invention described below. A method for fabricating a heat sink for use with a semiconductor component according to the present invention comprises forming a metal carbide on the surface of diamond particles by filling a vessel with a plurality of diamond particles, and then bringing the outer surface of the diamond particles in contact with a molten first metal. Then, the interstices of the resulting sample are impregnated with a molten second metal.

Preferably, after the first metal alone is heated together with diamond particles to form a metal carbide, the remainder of the first metal is evaporated, and the second metal is heated to melting thereafter.

It is also preferred that the first metal comprises components having a melting point lower than that of the components constituting the second metal, such that only the first metal is molten to form the metal carbide when heating the first and the second metals at the same time with the diamond particles; and that, the second metal is allowed to melting thereafter.

Provided that the conditions allow the metal to undergo melting, the metal referred to in the above fabrication method may be molten in vacuum or under pressure. However, care should be taken that a large part (50% or more) of diamond does not suffer degradation. That is, preferably, the process is performed at a temperature of 1,100° C. or lower. It is possible to carry out the process at a temperature of 1,100° C. or higher if the pressure is elevated to such a region under which the diamond phase remains stable; however, under such a condition, diamond particles undergo solid reaction with each other so as to be sintered. In such a case, the structure targeted by the present invention cannot be implemented.

In the semiconductor device package according to the present invention, the heat sink for use with a semiconductor component described above is brought into thermal contact with a semiconductor component, provided that the heat sink comprises a connection portion in which at least two diamond particles incorporated in the heat sink are arranged on the surface connecting the heat sink with the semiconductor component.

In this manner, a semiconductor package having excellent heat-releasing properties during assembling or upon operation of the semiconductor component can be realized.

DETAILED DESCRIPTION OF THE INVENTION

An embodiment of the present invention is described in detail with reference to the attached drawings.

Figure 1:
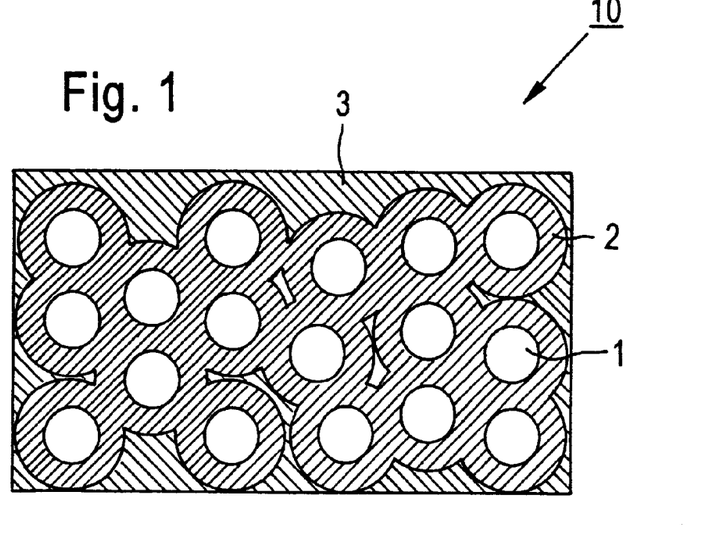
FIG. 1 shows schematically a heat sink for use with a semiconductor component according to an embodiment of the present invention.

FIG. 1 shows schematically the constitution of a heat sink material for use with a semiconductor component according to an embodiment of the present invention. Referring to FIG. 1, a heat sink 10 for use with a semiconductor component according to an embodiment of the present invention comprises a plurality of diamond particles 1, a metal carbide 2, and a metal 3. The diamond particles 1 are isolated from each other. The metal carbide 2 is formed on the outer periphery of the isolated diamond particles 1 to connect the diamond particles 1 with each other. In this manner, the metal carbide 2 and the diamond particles 1 form a matrix. The metal 3 is present in the interstices of the matrix.

A method for fabricating the above heat sink material for use with a semiconductor component according to the present invention is described below.

FIG. 2 to FIG. 7 schematically show the fabrication steps of a heat sink material for use with a semiconductor component according to an embodiment of the present invention.

Figure 2:
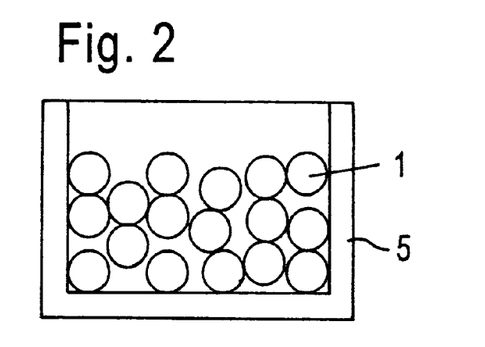
FIG. 2 shows schematically a first step of a method for fabricating a heat sink for use with a semiconductor component, according to an embodiment of the present invention.

Referring to FIG. 2, diamond particles 1 are placed inside a vessel 5.

Figure 3:
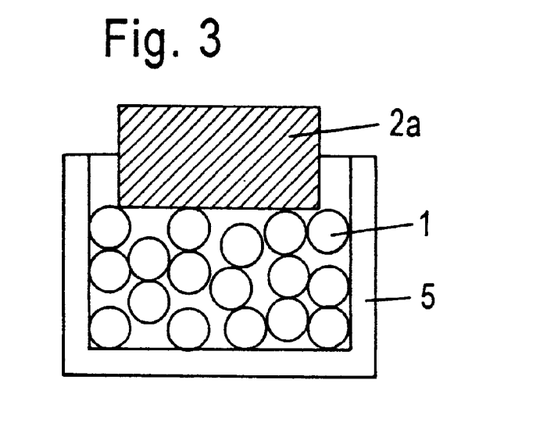
FIG. 3 shows schematically a second step of a method for fabricating a heat sink for use with a semiconductor component, according to an embodiment of the present invention.

Referring next to FIG. 3, a metal 2a is provided in contact with diamond particles 1. The metal 2a comprises an alloy of, for instance, Ti (the metal component for a metal carbide) and at least one metal selected from the group consisting of Ag, Cu, Al, and Au. A preferable metal component other than Ti is Zr or Hf, but also usable are combinations of metals selected from Groups 4a to 7a of the periodic table. From the viewpoint of thermal characteristics, the amount of Ti is preferably small, but Ti incorporated in too small an amount is ineffective. Thus, the alloy 2a preferably contains from 0.1 to 8.0% by weight of Ti.

Figure 4:
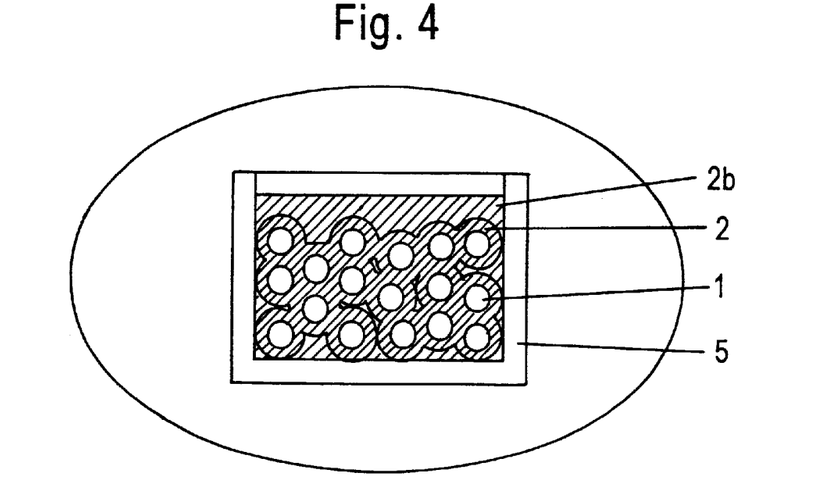
FIG. 4 shows schematically a third step of a method for fabricating a heat sink for use with a semiconductor component, according to an embodiment of the present invention.

Referring to FIG. 4, the metal 2a is made molten by heating. The molten metal 2b permeates the interstices of the diamond particles 1, and Ti incorporated in the molten metal 2b reacts with the diamond to form a metal carbide 2 comprising TiC on the surface of the diamond particles 1. Depending on the conditions, graphite (not shown) may be formed occasionally at the same time on heating. The graphite is obtained from the diamond.

More graphite tends to generate with elevating melting temperature of the metal 2a and with increasing the duration of the heating. The use of an alloy for the metal 2a, which is later made molten, is effective, because the melting point can be lowered so as to prevent damage from occurring to the diamond and to decrease the amount of graphite that is generated by the heating.

Graphite is inferior to diamond from the viewpoint of thermal conductivity: however, it sometimes functions effectively to bond the diamond particles. Moreover, the presence of graphite in small quantity is of no problem, because it does not greatly influence the thermal conductivity of the material as a whole.

The metal 2b can be evaporated by heating it in vacuum.

Figure 5:
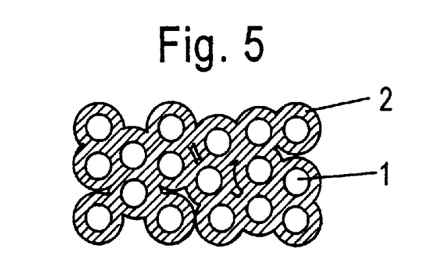
FIG. 5 shows schematically a fourth step of a method for fabricating a heat sink for use with a semiconductor component, according to an embodiment of the present invention.

Referring to FIG. 5, it can be seen that only diamond 1 and metal carbide 2 remain after the metal 2b is evaporated. The resulting structure comprises diamond particles 1 embedded in the matrix of the metal carbide 2. Diamond 1 is present as particles, and the particles are not in contact. However, the diamond particles 1 formed by the method above are joined with each other by the metal carbide, and are prevented from disuniting. Interstitial spaces can be found to form in the matrix composed of diamond particles 1 and the metal carbide 2.

Figure 6:
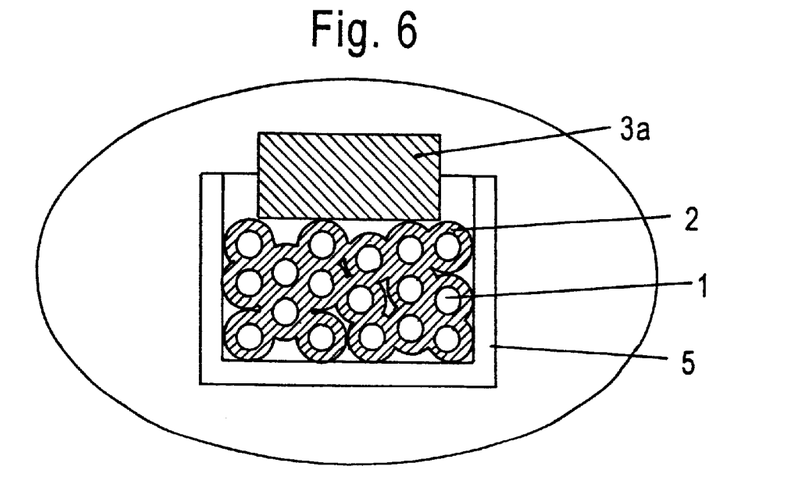
FIG. 6 shows schematically a fifth step of a method for fabricating a heat sink for use with a semiconductor component, according to an embodiment of the present invention.
Figure 7:
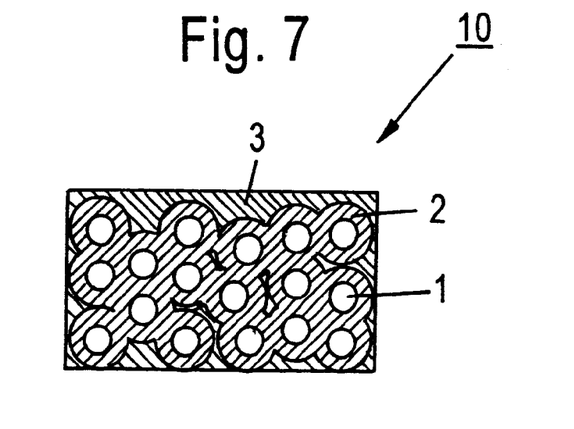
FIG. 7 shows schematically a sixth step of a method for fabricating a heat sink for use with a semiconductor component, according to an embodiment of the present invention.

Referring next to FIG. 6, a metal 3a is in contact with the matrix comprising diamond particles 1 and the metal carbide 2. The metal 3a comprises at least one selected from the group consisting of Ag, Cu, Al, and Au. By melting the metal 3a, the metal 3a easily penetrates the interstices of the matrix comprising the diamond particles 1 and the metal carbide 2 so as to fill the interstices. For the metal 3a, which is molten and used for infiltration, an elemental metal is preferred because it has a high thermal conductivity. If an alloy comprising two or more types of metal is used, on the other hand, the interstices can be filled up more easily because of the lowered melting point. However, the use of an alloy is disadvantageous because it reduces the resultant thermal conductivity. Thus a heat sink material for use with a semiconductor component as shown in FIG. 7 is implemented.

In the heat sink material for use with a semiconductor component thus implemented, the diamond particles 1, the metal carbide 2, and the metal 3 are brought into tight contact with each other both thermally and mechanically, and they yield a coefficient of thermal expansion that is close to the value of a semiconductor material. Accordingly, the resulting material functions sufficiently as a heat sink material for use with a semiconductor component.

Figure 8:
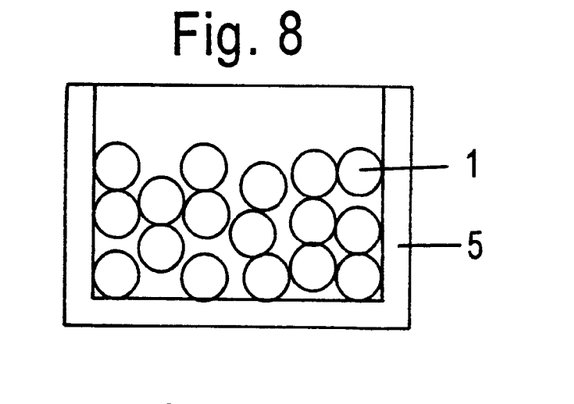
FIG. 8 shows schematically a first step of another method for fabricating a heat sink for use with a semiconductor component, according to another embodiment of the present invention.

A heat sink material for use with a semiconductor component can be fabricated in accordance with another process. FIGS. 8 to 12 schematically show the steps for fabricating a heat sink material for use with a semiconductor component according to another embodiment of the present invention. Referring to FIG. 8, diamond particles 1 are placed inside a vessel 5.

Figure 9:
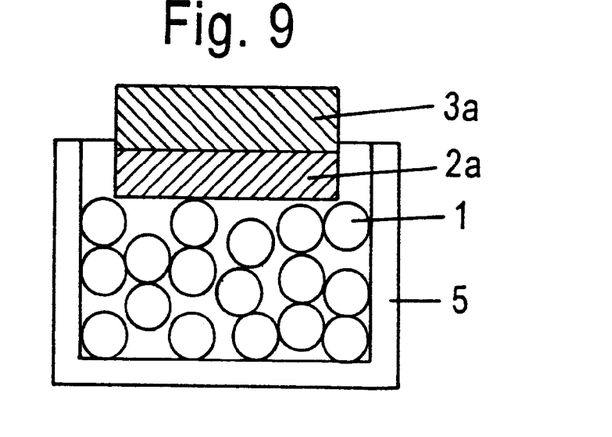
FIG. 9 shows schematically a second step of another method for fabricating a heat s ink for use with a semiconductor component, according to another embodiment of the present invention.

Referring next to FIG. 9, a metal 2a and a metal 3a are provided in contact with the diamond particles 1. The metal 2a comprises an alloy of, for instance, Ti (the metal component for a metal carbide) and at least one metal selected from the group consisting of Ag, Cu, Al, and Au. The metal 3a comprises an alloy containing at least one metal selected from the group consisting of Ag, Cu, Al, and Au, but free of Ti (the metal component for a metal carbide).

A preferable metal component for the metal carbide other than Ti is Zr or Hf, but also usable are combinations of metals selected from Groups 4a to 7a of the periodic table. From the viewpoint of thermal characteristics, the amount of Ti is preferably small, but Ti incorporated in too small an amount is ineffective. Thus, the alloy 2a preferably contains from 0.1 to 8.0% by weight of Ti.

Figure 10:
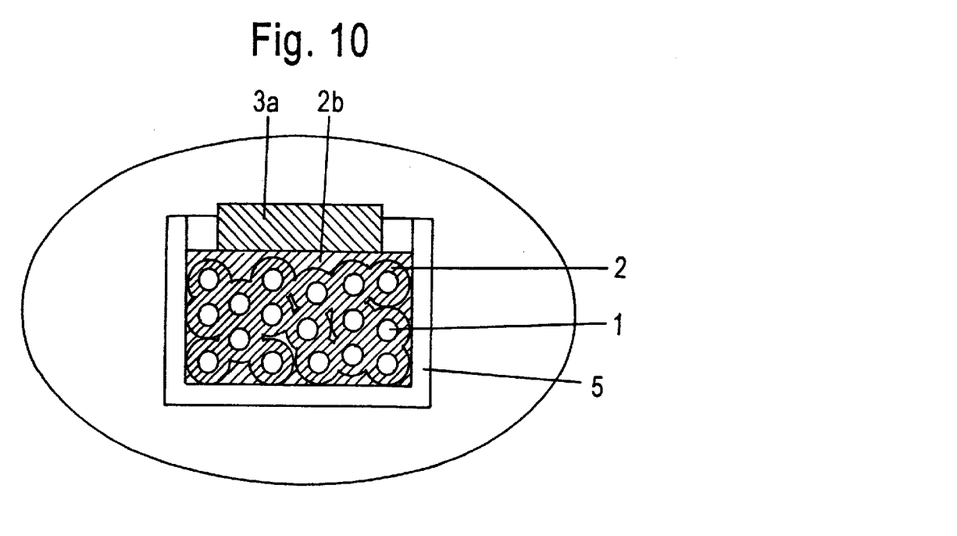
FIG. 10 shows schematically a third step of another method for fabricating a heat sink for use with a semiconductor component, according to another embodiment of the present invention.

Referring to FIG. 10, only metal 2a is melted by heating. The molten metal 2b permeates the interstices of the diamond particles 1, and Ti incorporated in the molten metal 2b reacts with diamond to form a metal carbide (TiC) 2 on the surface of the diamond particles 1. Depending on the conditions, graphite (not shown) may occasionally be formed at the same time upon heating. The graphite is obtained from diamond. More graphite tends to generate with elevation of the melting temperature of the metal 2a and with increasing duration of the heating.

Once metal 2a undergoes melting, the metal 3a in contact therewith also undergoes melting more easily. Even if the melting of metal 2a does not facilitate melting of metal 3a, the metal 3a. can be melted by raising the temperature to the melting point of the metal 3a or higher. In this manner, the molten metal 3a infiltrates the interstices of the matrix comprising diamond particles 1 and the metal carbide 2.

Figure 11:
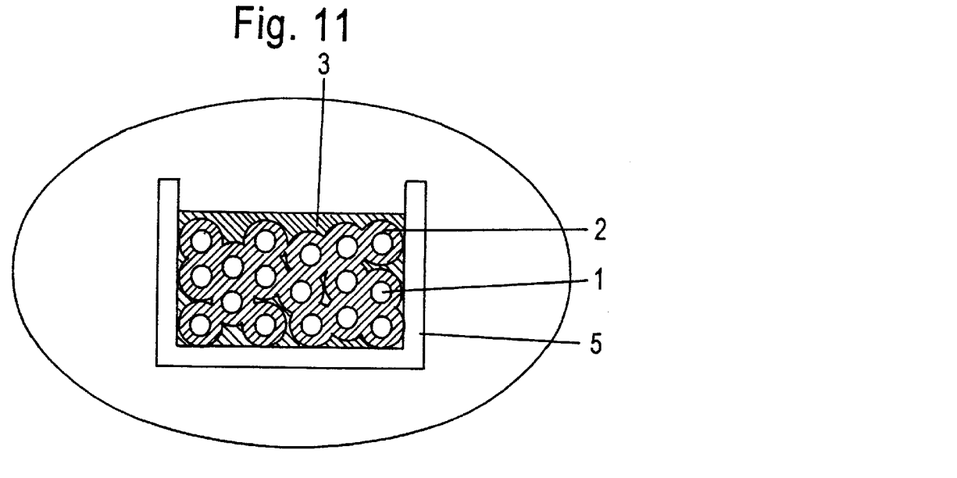
FIG. 11 shows schematically a fourth step of another method for fabricating a heat sink for use with a semiconductor component, according to another embodiment of the present invention.
Figure 12:
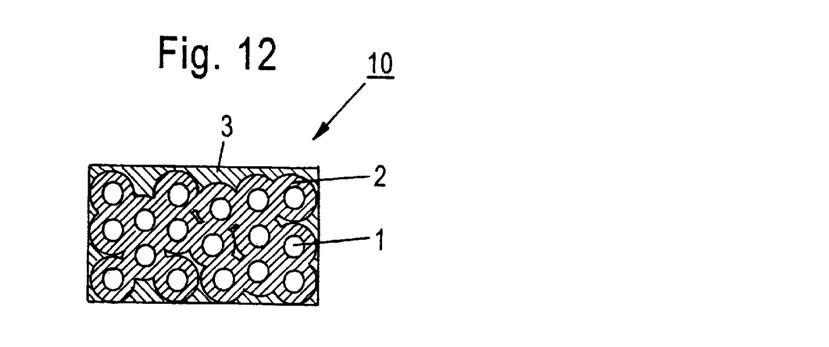
FIG. 12 shows schematically a fifth step of another method for fabricating a heat sink for use with a semiconductor component, according to another embodiment of the present invention.

Referring now to FIG. 11, by carrying out the two-step melting process for melting the metals 2a and 3a, a matrix is first formed by the diamond particles 1 and the metal carbide 2, and then, a structure comprising the metal 2a or 3a incorporated in the interstices of the matrix is formed. Thus there is obtained a heat sink material for use with a semiconductor component, as shown in FIG. 12.

In order to lower the melting point, the metal 2a is preferably an alloy. However, the use of an alloy is disadvantageous in one aspect because it impairs overall thermal conductivity. Thus, in the present method, pure metal is used preferentially for the metal 3a, so as to make it possible to maintain the thermal conductivity of the alloy comprising metals 2a and 3a at a sufficiently high level.

EXAMPLES

The present invention is described in further detail below by making reference to Examples, but it should be noted that the present invention is not only limited thereto.

Example 1

Diamond particles 1 weighing 0.5 g and having an average diameter of from 10 to 700 μm were charged into a quartz vessel 5 having a diameter of 10 mm and a height of about 10 mm (FIG. 2), and there after a block of metal containing from 0.2 to 2.0 g of an active silver solder 2a (containing Ag, Cu, and Ti at a ratio of Ag:Cu:Ti= 0.7:0.28:0.02) was mounted thereon (FIG. 3). The assemblage was then held within a temperature range of from about 900 to 1,100° C. in vacuum ($10^{-5}$ Torr) for a duration of 3 to 10 minutes (FIG. 4). In this manner, the active silver solder 2a infiltrated the interstices of the diamond particles 1, and the residual molten metal 2b was evaporated to obtain a porous body comprising diamond particles 1 bonded together by TiC 2 to form a matrix (FIG. 5). Then, a block of Ag, Cu, or Al was mounted on the resulting porous body, and was allowed to melt in vacuum ($10^{-5}$ Torr) by holding the temperature for a duration of 2 minutes at about 970, 1,100, or 800° C., respectively. Thus, Ag, Cu, or Al was allowed to fill the pores (FIG. 6). Thus there were obtained samples 10, each comprising a porous body made from diamond particles 1 and TiC 2 and with the pores thereof being filled with Ag, Cu, or Al 3 (FIG. 7). Thermal conductivity of the thus obtained samples was measured, and the results are summarized in Tables 1 and 2.

TABLE 1

| Particle diameter of diamond (μm) | Metal impregnated later | Thermal conductivity (W/mK) |
|---|---|---|
| 700 | Silver | 900 |
| 300 | Silver | 880 |
| 200 | Silver | 790 |
| 100 | Silver | 630 |
| 60 | Silver | 500 |
| 10 | Silver | 350 |
| 300 | Copper | 800 |
| 300 | Aluminum | 650 |

TABLE 2

| Particle diameter of diamond (μm) | Amount of diamond (g) | Amount of active silver solder (g) | Thermal conductivity (W/mK) |
|---|---|---|---|
| 300 | 0.5 | 2.0 | 750 |
| 300 | 0.5 | 1.0 | 830 |
| 300 | 0.5 | 0.5 | 880 |
| 300 | 0.5 | 0.3 | 900 |
| 300 | 0.5 | 0.2 | Sample Unavailable |
| 300 | 0.5 | 0.1 | Sample Unavailable |
| 300 | 0.5 | 0.0 | Sample Unavailable |

It can be seen from the above results that Ag, Cu, or Al functions effectively as a metal to be infiltrated into the structure, and that a thermal conductivity of 500 W/mK or higher is achieved by using such a metal. Furthermore, it has been found that diamond particles 60 μm or larger in diameter are effective to yield a thermal conductivity of not higher than the infiltrated metal. It also found that better characteristics are obtained by decreasing quantity of silver solder. However, silver solder has an important function to form TiC, because, when the quantity thereof becomes 0.3 g or less, it is difficult to form the desired material.

Although the coefficient of thermal expansion differs depending on the volume fraction of diamond, a value in a range of from 7 to 12 ppm/K on average is obtained for the temperature range from room temperature to 500° C. This value for the coefficient of thermal expansion falls between those for a metal (from 16 to 20 ppm/K) and that of diamond (2 ppm/K).

Example 2

Diamond particles 1 weighing 0.5 g and having an average diameter of from 10 to 700 μm were charged into a quartz vessel 5 having a diameter of 10 mm and a height of about 10 mm (FIG. 8), and after mounting thereon a metal block containing from 0.2 to 2.0 g of an active silver solder 2a (containing Ag, Cu, and Ti at a ratio of Ag:Cu:Ti= 0.7:0.28:0.02) together with 0 to 2 g of Ag or Cu 3a (FIG. 9), the assemblage was held at a temperature of 930° C. in vacuum ($10^{-5}$ Torr) for a duration of 1 to 3 minutes (FIG. 10). In this manner, the active silver solder 2a first infiltrated the interstices of the diamond particles 1. Then, the resulting structure was held at a temperature of 980° C. in vacuum ($10^{-5}$ Torr) for a duration of 1 to 3 minutes. This time, Ag or Cu 3a was molten, and infiltrated the interstices of the structure (FIG. 11). Thus, TiC 2 was formed on the surface of diamond particles 1, and a sample 10 comprising Ag or Cu 3a incorporated into the pores of the resulting porous body formed by diamond particles 1 and TiC 2 was obtained (FIG. 12). In addition to TiC 2, graphite was also found to form under high temperature conditions. The thermal conductivity of the resulting sample was measured. Thus obtained results are shown in Tables 3 and 4.

TABLE 3

| Particle diameter of diamond (μm) | Metal impregnated later | Thermal conductivity (W/mK) |
|---|---|---|
| 700 | Silver | 750 |
| 300 | Silver | 710 |
| 200 | Silver | 690 |
| 100 | Silver | 600 |
| 60 | Silver | 450 |
| 10 | Silver | 300 |

TABLE 4

| Particle diameter of diamond (μm) | Amount of diamond (g) | Amount of active silver solder (g) | Amount of silver (g) | Thermal conductivity (W/mK) |
|---|---|---|---|---|
| 300 | 0.5 | 2.0 | 1.0 | 590 |
| 300 | 0.5 | 1.0 | 1.0 | 650 |
| 300 | 0.5 | 0.5 | 1.0 | 700 |
| 300 | 0.5 | 0.3 | 1.0 | 750 |
| 300 | 0.5 | 0.2 | 1.0 | Sample Unavailable |
| 300 | 0.5 | 0.1 | 1.0 | Sample Unavailable |
| 300 | 0.5 | 0.0 | 1.0 | Sample Unavailable |
| 300 | 0.5 | 1.0 | 0.0 | 300 |

It is seen from the results above that a different metal can be introduced together with an active silver solder, and that they can be molten separately and infiltrated; and that thereby specimens having a thermal conductivity of 450 W/mK or higher and comprising diamond particles 60 μm or larger in diameter are obtainable. Furthermore, it has been found that better characteristics are obtained with decreasing the quantity of the active silver solder. However, silver solder has an important role to form TiC, because, when the quantity thereof becomes 0.2 g or less, it is difficult to form the material. Moreover, the thermal conductivity drops with increasing amount of the active silver solder. Accordingly, the incorporation of active silver solder alone is completely ineffective.

As was the case in Example 1, furthermore, the value for coefficient of thermal expansion in the temperature range of room temperature to 500° C. falls in a range of 7 to 12 ppm/K on average.

Example 3

In FIGS. 13a and 13b through FIGS. 18a and 18b there are schematically shown the process steps for producing heat sink for use with a semiconductor component according to Example 3 of the present invention. Cases using different molds are shown in parallel with each other.

Figure 13A:
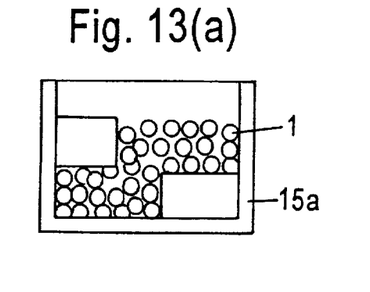
FIGS. 13a and 13b schematically show first steps of a method for fabricating a heat sink for use with a semiconductor component according to Example 3 of the present invention, in which a different mold is used.
Figure 13B:
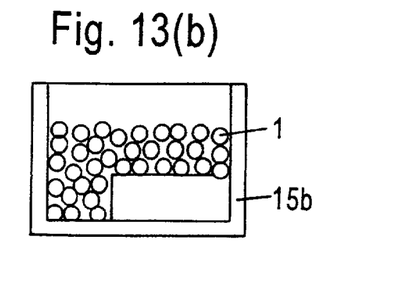

Referring to FIGS. 13a and 13b, diamond particles 1 having an average diameter of 10 to 700 μm were placed in each of quartz vessels 15a and 15b differing from each other in internal shape.

Figure 14A:
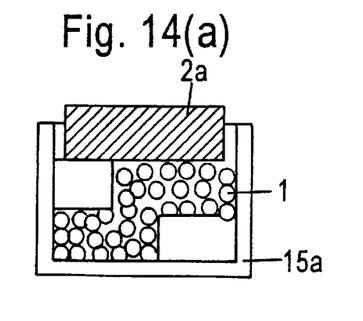
FIGS. 14a and 14b schematically show second steps of a method for fabricating a heat sink for use with a semiconductor component according to Example 3 of the present invention, in which a different mold is used.
Figure 14B:
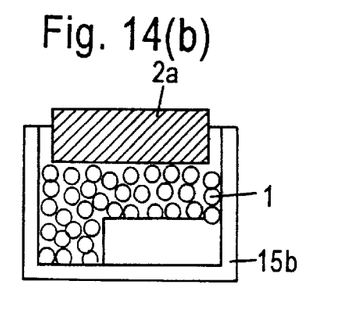

Referring to FIGS. 14a and 14b, an active silver solder block 2a was mounted on the diamond particles 1. and was melted by maintaining the resulting structure in the temperature range of about 900 to 1,100° C. in vacuum ($10^{-5}$ Torr) for a duration of from 3 to 10 minutes.

Figure 15A:
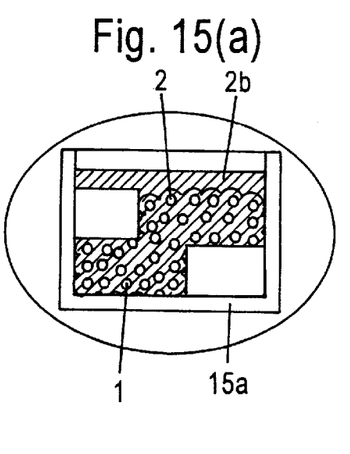
FIGS. 15a and 15b schematically show third steps of a method for fabricating a heat sink for use with a semiconductor component according to Example 3 of the present invention, in which a different mold is used.
Figure 15B:
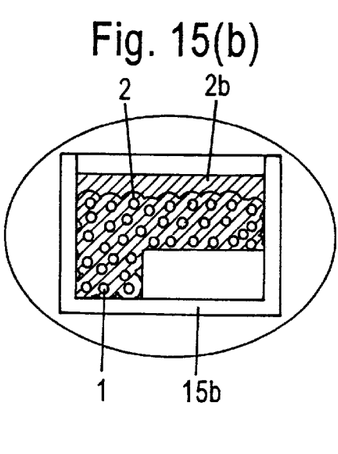

In this manner, referring to FIGS. 15a and 15b, the molten active silver solder 2b infiltrated the interstices of the diamond particles 1. and after a metal carbide was formed through the reaction with the diamond particles 1, the residual molten metal 2b was allowed to evaporate.

Figure 16A:
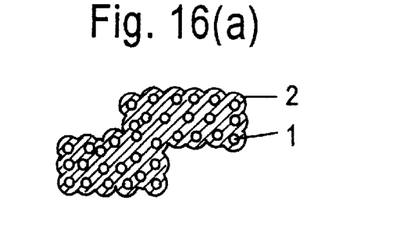
FIGS. 16a and 16b schematically show fourth steps of a method for fabricating a heat sink for use with a semiconductor component according to Example 3 of the present invention, in which a different mold is used.
Figure 16B:
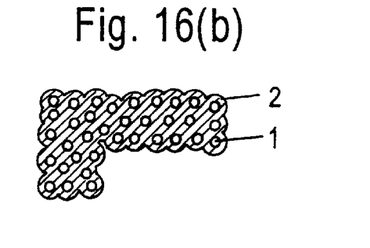

Thus, referring to FIGS. 16a and 16b, porous bodies each comprising diamond particles 1 bonded by TiC 2 were obtained.

Figure 17A:
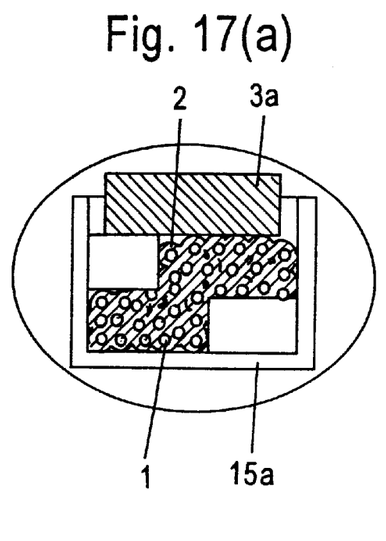
FIGS. 17a and 17b schematically show fifth steps of a method for fabricating a heat sink for use with a semiconductor component according to Example 3 of the present invention, in which a different mold is used.
Figure 17B:
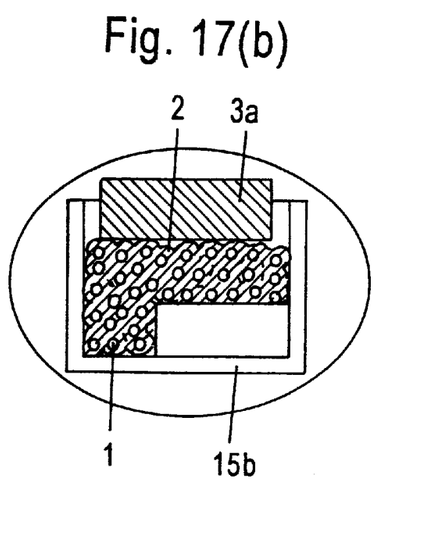
Figure 18A:
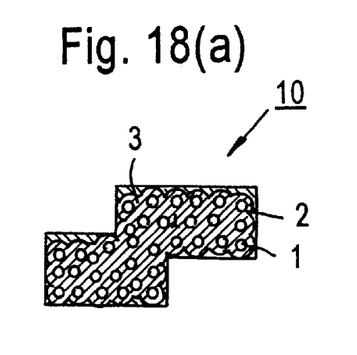
FIGS. 18a and 18b schematically show sixth steps of a method for fabricating a heat sink for use with a semiconductor component according to Example 3 of the present invention, in which a different mold is used.
Figure 18B:
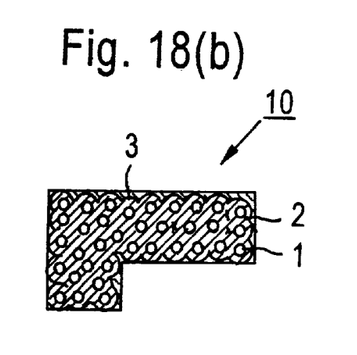

Referring to FIGS. 17a and 17b, thereafter, a metal block 3a comprising Ag, Cu, or Al was mounted on the resulting porous body, and was allowed to melt in vacuum ($10^{-5}$ Torr) by holding the temperature at about 970, 1,100, or 800° C. for a duration of 2 minutes. Thus, the metal 3a was allowed to fill the pores. By using molds differing in shape, heat sinks for use with a semiconductor component and having relatively freely choosable shape were obtained as shown in FIGS. 18a and 18b.

Example 4

Figure 19:
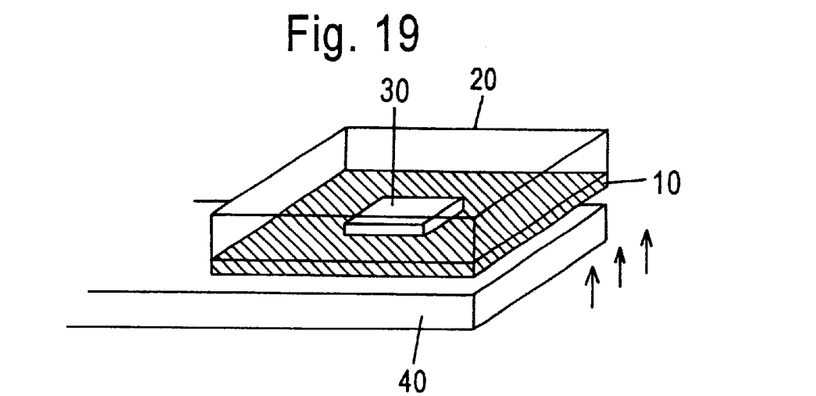
FIG. 19 shows schematically a perspective view of a heat sink for use with a semiconductor component according to the present invention, which is joined with a semiconductor component and enclosed in a device package.

FIG. 19 is a schematically drawn perspective view showing the heat sink according to the present invention bonded with a semiconductor component and packaged. Referring to FIG. 19, a semiconductor component 30 containing Si or GaAs as the principal material is electrically contacted, the resulting structure is enclosed in a package 20, and the heat sink side 10 is brought into contact with a heat pipe 40. The semiconductor component 30 was operated in order to test for heat radiation. A fin was provided on the back of the heat sink 10 to release heat.

As a result, the thermal resistance was found to decrease by using the present invention as the heat sink 10 in the place of Cu. The results are summarized in TABLE 5.

TABLE 5

| Sample | Temperature difference for 10 W (° C.) | Thermal resistance (° C./W) |
|---|---|---|
| Cu | 73 | 7.3 |
| No. (1) in TABLE 1 | 63 | 6.3 |
| No. (2) in TABLE 1 | 50 | 5 |

Furthermore, in the case where a metal solder is used to join the heat sink 10 with the semiconductor component 30, it is found necessary to incorporate 2 or more diamond particles in the bonding plane of the heat sink located under the semiconductor component 30.

As described above, the heat sink material for use with a semiconductor component according to the present invention has a coefficient of thermal expansion close to that of a semiconductor material and a high thermal conductivity. Accordingly, by embedding the heat sink according to the present invention into a semiconductor device package, the heat that is generated upon assembly of the device or during operation of the semiconductor component can be released efficiently.

While the invention has been described in detail and with reference to specific embodiments thereof, it will be apparent to one skilled in the art that various changes and modifications can be made therein without departing from the spirit and scope thereof.

What is claimed is:

1. A method for fabricating a heat sink material for use with a semiconductor component, comprising:
    forming a metal carbide on the surface of diamond particles, thereby constituting an interconnecting matrix with interstices therein, by filling a vessel with a plurality of diamond particles, and then contacting the outer surface of the diamond particles with a molten first metal; and
    impregnating the interstices of the resulting material with a molten second metal.

2. A method for fabricating a heat sink material for use with a semiconductor component, comprising:
    forming a metal carbide on the surface of diamond particles by filling a vessel with a plurality of diamond particles, and then contacting the outer surface of the diamond particles with a molten first metal; and
    impregnating the interstices of the resulting material with a molten second metal, wherein,
    the metal carbide is formed by heating the first metal alone with the diamond particles, and after evaporating the remainder of the first metal, the second metal is heated to melting.

3. A method for fabricating a heat sink material for use with a semiconductor component, comprising:
    forming a metal carbide on the surface of diamond particles by filling a vessel with a plurality of diamond particles, and then contacting the outer surface of the diamond particles with a molten first metal; and
    impregnating the interstices of the resulting material with a molten second metal, wherein,
    the first metal comprises components having a melting point lower than that of the components constituting the second metal, such that:
only the first metal is molten to form the metal carbide by heating the first and the second metals at the same time with the diamond particles, and that the second metal is melted thereafter.

4. The method according to claim 1, wherein,
    the melting points of the first and the second metals are 1,100° C. or lower.

5. The method according to claim 1, wherein,
    the first and the second metals are molten under a pressure of 1,000 at or under vacuum.

6. The method according to claim 2, comprising forming the metal carbide on the surfaces of the diamond particles and impregnating the interstices to form the heat sink material comprising a plurality of diamond particles, the second metal, and the metal carbide, wherein the metal carbide is on the surface of the diamond particles thereby constituting an interconnecting matrix with interstices therein, and the second metal fills the interstices of the matrix.

7. The method according to claim 3, comprising forming the metal carbide on the surfaces of the diamond particles and impregnating the interstices to form the heat sink material comprising a plurality of diamond particles, the second metal, and the metal carbide, wherein the metal carbide is on the surface of the diamond particles thereby constituting an interconnecting matrix with interstices therein, and the second metal fills the interstices of the matrix.

* * * * *